(12) United States Patent
Champlin

(10) Patent No.: US 6,417,669 B1
(45) Date of Patent: Jul. 9, 2002

(54) SUPPRESSING INTERFERENCE IN AC MEASUREMENTS OF CELLS, BATTERIES AND OTHER ELECTRICAL ELEMENTS

(76) Inventor: Keith S. Champlin, 5437 Elliot Ave. South, Minneapolis, MN (US) 55417

( * ) Notice: Subject to any disclaimer, the term of this patent is extended or adjusted under 35 U.S.C. 154(b) by 0 days.

(21) Appl. No.: 09/878,625

(22) Filed: Jun. 11, 2001

(51) Int. Cl.[7] .......................................... G01N 27/416
(52) U.S. Cl. ..................................................... 324/426
(58) Field of Search ........................ 324/426; 327/599; 333/12; 361/111

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christanson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |

(List continued on next page.)

OTHER PUBLICATIONS

National Semiconductor Corportation, "High Q Notch Filter", Mar. 1969, Linear Brief 5.*
Burr–Brown Corporation, "Design A 60 Hz Notch Filter with the UAF42", Jan. 1994, AB–071.*

(List continued on next page.)

Primary Examiner—Gregory Toatley
(74) Attorney, Agent, or Firm—Westman, Champlin & Kelly, P.A.

(57) ABSTRACT

The disclosed invention relates to measuring an ac dynamic parameter (e.g., impedance, admittance, resistance, reactance, conductance, susceptance) of an electrochemical cell/battery or other electrical element under conditions of possible interference from potential sources such as ac magnetic fields and/or ac currents at the powerline frequency and its harmonics. More generally, it relates to evaluating a signal component at a known frequency $f_1$ under conditions of possible hum, noise, or other spurious interference at one or more other known frequencies. A microprocessor or microcontroller commands A/D circuitry to sample a band-limited signal at M evenly spaced times per period $1/f_1$ distributed over an integer number N of such periods and calculates time-averaged Fourier coefficients from these samples. The frequency response of the calculated Fourier coefficients displays perfect nulls at evenly spaced frequencies either side of frequency $f_1$. By choosing N according to algorithms disclosed herein, null responses are made to coincide with the one or more frequencies of potential hum, noise, or other spurious interference.

98 Claims, 3 Drawing Sheets

U.S. PATENT DOCUMENTS

| | | | | |
|---|---|---|---|---|
| 3,984,762 | A | 10/1976 | Dowgiallo, Jr. | 324/29.5 |
| 3,989,544 | A | 11/1976 | Santo | 429/65 |
| 4,008,619 | A | 2/1977 | Alcaide et al. | 73/398 |
| 4,024,953 | A | 5/1977 | Nailor, III | 206/344 |
| 4,053,824 | A | 10/1977 | Dupuis et al. | 324/29.5 |
| 4,070,624 | A | 1/1978 | Taylor | 327/158 |
| 4,086,531 | A | 4/1978 | Bernier | 324/158 |
| 4,112,351 | A | 9/1978 | Back et al. | 324/16 |
| 4,114,083 | A | 9/1978 | Benham et al. | 320/39 |
| 4,126,874 | A | 11/1978 | Suzuki et al. | 354/60 |
| 4,178,546 | A | 12/1979 | Hulls et al. | 324/158 |
| 4,193,025 | A | 3/1980 | Frailing et al. | 324/427 |
| 4,207,611 | A | 6/1980 | Gordon | 364/580 |
| 4,217,645 | A | 8/1980 | Barry et al. | 364/483 |
| 4,315,204 | A | 2/1982 | Sievers et al. | 322/28 |
| 4,316,185 | A | 2/1982 | Watrous et al. | 340/636 |
| 4,322,685 | A | 3/1982 | Frailing et al. | 324/429 |
| 4,363,407 | A | 12/1982 | Barkler et al. | 209/3.3 |
| 4,369,407 | A | 1/1983 | Korbell | 324/416 |
| 4,379,989 | A | 4/1983 | Kurz et al. | 320/26 |
| 4,379,990 | A | 4/1983 | Sievers et al. | 322/99 |
| 4,390,828 | A | 6/1983 | Converse et al. | 320/32 |
| 4,392,101 | A | 7/1983 | Saar et al. | 320/20 |
| 4,396,880 | A | 8/1983 | Windebank | 320/21 |
| 4,408,157 | A | 10/1983 | Beaubien | 324/62 |
| 4,412,169 | A | 10/1983 | Dell'Orto | 320/64 |
| 4,423,378 | A | 12/1983 | Marino et al. | 324/427 |
| 4,423,379 | A | 12/1983 | Jacobs et al. | 324/429 |
| 4,424,491 | A | 1/1984 | Bobbett et al. | 324/433 |
| 4,459,548 | A | 7/1984 | Lentz et al. | 324/158 |
| 4,514,694 | A | 4/1985 | Finger | 324/429 |
| 4,520,353 | A | 5/1985 | McAuliffe | 340/636 |
| 4,633,418 | A | 12/1986 | Bishop | 364/554 |
| 4,659,977 | A | 4/1987 | Kissel et al. | 320/64 |
| 4,663,580 | A | 5/1987 | Wortman | 320/35 |
| 4,667,146 | A | 5/1987 | Cooper et al. | 320/22 |
| 4,667,279 | A | 5/1987 | Maier | 363/46 |
| 4,678,998 | A | 7/1987 | Muramatsu | 324/427 |
| 4,679,000 | A | 7/1987 | Clark | 324/428 |
| 4,680,528 | A | 7/1987 | Mikami et al. | 320/32 |
| 4,697,134 | A | 9/1987 | Burkum et al. | 320/48 |
| 4,707,795 | A | 11/1987 | Alber et al. | 364/550 |
| 4,709,202 | A | 11/1987 | Koenck et al. | 320/43 |
| 4,710,861 | A | 12/1987 | Kanner | 363/46 |
| 4,719,428 | A | 1/1988 | Liebermann | 324/436 |
| 4,743,855 | A | 5/1988 | Randin et al. | 324/430 |
| 4,745,349 | A | 5/1988 | Palanisamy et al. | 320/22 |
| 4,816,768 | A | 3/1989 | Champlin | 324/428 |
| 4,820,966 | A | 4/1989 | Fridman | 320/32 |
| 4,825,170 | A | 4/1989 | Champlin | 324/436 |
| 4,847,547 | A | 7/1989 | Eng, Jr. | 320/35 |
| 4,849,700 | A | 7/1989 | Morioka et al. | 324/427 |
| 4,876,495 | A | 10/1989 | Palanisamy et al. | 320/18 |
| 4,881,038 | A | 11/1989 | Champlin | 324/426 |
| 4,912,416 | A | 3/1990 | Champlin | 324/430 |
| 4,913,116 | A | 4/1990 | Katogi et al. | 123/425 |
| 4,929,931 | A | 5/1990 | McCuen | 340/636 |
| 4,931,738 | A | 6/1990 | MacIntyre et al. | 324/435 |
| 4,937,528 | A | 6/1990 | Palanisamy | 324/430 |
| 4,947,124 | A | 8/1990 | Hauser | 324/430 |
| 4,956,597 | A | 9/1990 | Heavey et al. | 320/14 |
| 4,968,941 | A | 11/1990 | Rogers | 324/428 |
| 4,968,942 | A | 11/1990 | Palanisamy | 324/430 |
| 5,004,979 | A | 4/1991 | Marino et al. | 324/160 |
| 5,032,825 | A | 7/1991 | Xuznicki | 340/636 |
| 5,047,722 | A | 9/1991 | Wurst et al. | 324/430 |
| 5,087,881 | A | 2/1992 | Peacock | 324/378 |
| 5,126,675 | A | 6/1992 | Yang | 324/435 |
| 5,140,269 | A | 8/1992 | Champlin | 324/433 |
| 5,144,218 | A | 9/1992 | Bosscha | 320/44 |
| 5,144,248 | A | 9/1992 | Alexandres et al. | 324/428 |
| 5,160,881 | A | 11/1992 | Schramm et al. | 322/7 |
| 5,170,124 | A | 12/1992 | Blair et al. | 324/434 |
| 5,179,335 | A | 1/1993 | Nor | 320/21 |
| 5,204,611 | A | 4/1993 | Nor et al. | 320/21 |
| 5,214,370 | A | 5/1993 | Harm et al. | 320/35 |
| 5,214,385 | A | 5/1993 | Gabriel et al. | 324/434 |
| 5,241,275 | A | 8/1993 | Fang | 324/430 |
| 5,254,952 | A | 10/1993 | Salley et al. | 324/429 |
| 5,266,880 | A | 11/1993 | Newland | 320/14 |
| 5,281,919 | A | 1/1994 | Palanisamy | 324/427 |
| 5,281,920 | A | 1/1994 | Wurst | 324/430 |
| 5,295,078 | A | 3/1994 | Stich et al. | 364/483 |
| 5,298,797 | A | 3/1994 | Redl | 307/246 |
| 5,300,874 | A | 4/1994 | Shimamoto et al. | 320/15 |
| 5,302,902 | A | 4/1994 | Groehl | 324/434 |
| 5,315,287 | A | 5/1994 | Sol | 340/455 |
| 5,321,626 | A | 6/1994 | Palladino | 364/483 |
| 5,331,268 | A | 7/1994 | Patino et al. | 320/20 |
| 5,336,993 | A | 8/1994 | Thomas et al. | 324/158.1 |
| 5,338,515 | A | 8/1994 | Betta et al. | 422/95 |
| 5,339,018 | A | 8/1994 | Brokaw | 320/35 |
| 5,343,380 | A | 8/1994 | Champlin | 363/46 |
| 5,347,163 | A | 9/1994 | Yoshimura | 307/66 |
| 5,352,968 | A | 10/1994 | Reni et al. | 320/35 |
| 5,365,160 | A | 11/1994 | Leppo et al. | 320/22 |
| 5,365,453 | A | 11/1994 | Startup et al. | 364/481 |
| 5,381,096 | A | 1/1995 | Hirzel | 324/427 |
| 5,412,323 | A | 5/1995 | Kato et al. | 324/429 |
| 5,426,371 | A | 6/1995 | Salley et al. | 324/429 |
| 5,426,416 | A | 6/1995 | Jefferies et al. | 340/664 |
| 5,432,426 | A | 7/1995 | Yoshida | 320/20 |
| 5,434,495 | A | 7/1995 | Toko | 320/44 |
| 5,435,185 | A | 7/1995 | Eagan | 73/587 |
| 5,442,274 | A | 8/1995 | Tamai | 320/23 |
| 5,449,996 | A | 9/1995 | Matsumoto et al. | 320/20 |
| 5,449,997 | A | 9/1995 | Gilmore et al. | 320/39 |
| 5,451,881 | A | 9/1995 | Finger | 324/433 |
| 5,455,026 | A | 10/1995 | Eagan | 73/591 |
| 5,457,377 | A | 10/1995 | Jonsson | 320/5 |
| 5,469,043 | A | 11/1995 | Cherng et al. | 320/31 |
| 5,485,090 | A | 1/1996 | Stephens | 324/433 |
| 5,488,300 | A | 1/1996 | Jamieson | 324/432 |
| 5,519,383 | A | 5/1996 | De la Rosa | 340/636 |
| 5,528,148 | A | 6/1996 | Rogers | 324/426 |
| 5,537,967 | A | 7/1996 | Tashiro et al. | 123/792.1 |
| 5,546,317 | A | 8/1996 | Andrieu | 364/481 |
| 5,548,273 | A | 8/1996 | Nicol et al. | 340/439 |
| 5,550,485 | A | 8/1996 | Falk | 324/772 |
| 5,561,380 | A | 10/1996 | Sway-Tin et al. | 324/509 |
| 5,562,501 | A | 10/1996 | Kinoshita et al. | 439/852 |
| 5,572,136 | A | 11/1996 | Champlin | 324/426 |
| 5,574,355 | A | 11/1996 | McShane et al. | 320/39 |
| 5,583,416 | A | 12/1996 | Klang | 320/22 |
| 5,585,728 | A | 12/1996 | Champlin | 324/427 |
| 5,589,757 | A | 12/1996 | Klang | 320/22 |
| 5,592,093 | A | 1/1997 | Klingbiel | 324/426 |
| 5,596,260 | A | 1/1997 | Moravec et al. | 320/30 |
| 5,598,098 | A | 1/1997 | Champlin | 324/430 |
| 5,602,462 | A | 2/1997 | Stich et al. | 323/258 |
| 5,606,242 | A | 2/1997 | Hull et al. | 320/48 |
| 5,621,298 | A | 4/1997 | Harvey | 320/5 |
| 5,633,985 | A | 5/1997 | Severson et al. | 395/2.76 |
| 5,642,031 | A | 6/1997 | Brotto | 320/21 |
| 5,650,937 | A | 7/1997 | Bounaga | 364/483 |
| 5,652,501 | A | 7/1997 | McClure et al. | 320/17 |
| 5,656,920 | A | 8/1997 | Cherng et al. | 320/31 |
| 5,675,234 | A | 10/1997 | Greene | 320/15 |
| 5,677,077 | A | 10/1997 | Faulk | 429/90 |
| 5,699,050 | A | 12/1997 | Kanazawa | 340/636 |
| 5,701,089 | A | 12/1997 | Perkins | 327/772 |

| | | | |
|---|---|---|---|
| 5,705,929 A | 1/1998 | Caravello et al. | 324/430 |
| 5,710,503 A | 1/1998 | Sideris et al. | 320/6 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,808,469 A | 9/1998 | Kopera | 324/43.4 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,969,625 A | 10/1999 | Russo | 340/636 |
| 6,002,238 A * | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,249,124 B1 | 6/2000 | Bertness | 324/426 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,150,793 A | 11/2000 | Lesesky et al. | 320/104 |
| 6,163,156 A | 12/2000 | Bertness | 324/426 |
| 6,172,483 B1 * | 1/2001 | Champlin | 320/134 |
| 6,172,505 B1 | 1/2001 | Bertness | 324/430 |
| 6,222,369 B1 | 4/2001 | Champlin | 324/430 |
| 6,225,808 B1 | 5/2001 | Varghese et al. | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 * | 7/2001 | Champlin | 320/134 |
| 6,294,896 B1 * | 9/2001 | Champlin | 320/134 |
| 6,294,897 B1 | 9/2001 | Champlin | 320/153 |
| 6,304,087 B1 | 10/2001 | Bertness | 324/426 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |

FOREIGN PATENT DOCUMENTS

| | | |
|---|---|---|
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59-017894 | 1/1984 |
| JP | 59-215674 | 12/1984 |
| JP | 60-225078 | 11/1985 |
| JP | 62-180284 | 8/1987 |
| JP | 63-027776 | 2/1988 |
| JP | 3-274479 | 12/1991 |
| JP | 3-282276 | 12/1991 |
| JP | 4-8636 | 1/1992 |
| JP | 4-131779 | 5/1992 |
| JP | 4-372536 | 12/1992 |
| JP | 5-216550 | 8/1993 |
| JP | 7-128414 | 5/1995 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

National Semiconductor Corportation, "LMF90—4th–Order Elliptic Notch Filter" Dec. 1994, RRD–B30M115.*

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", Mar. 1969, Linear Brief 5, Mar. 1969.

Burr–Brown Corporation, "Design A 60 Hz Notch Filter with the UAF42", Jan. 1994, AB–071, 1994.

National Semiconductor Corporation, "LMF90–$4^{th}$ –Order Elliptic Notch Filter", Dec. 1994, RRD–B30M115, Dec. 1994.

* cited by examiner

US 6,417,669 B1

SUPPRESSING INTERFERENCE IN AC MEASUREMENTS OF CELLS, BATTERIES AND OTHER ELECTRICAL ELEMENTS

BACKGROUND OF THE INVENTION

The present invention relates to measuring an ac dynamic parameter (e.g., impedance, admittance, resistance, reactance, conductance, susceptance) of an electrochemical cell/battery or other electrical element under conditions of possible interference from potential sources such as ac magnetic fields and/or ac currents at the powerline frequency and its harmonics. More specifically, it relates to evaluating a signal component at a known frequency under conditions of possible hum, noise, or other spurious interference at other known frequencies.

Electrochemical cells and batteries, such as primary cells/batteries, secondary (i.e., storage) cells/batteries, and fuel cells/batteries are important sources of electrical energy. Ac dynamic parameter measurements have proven very useful for cell/battery diagnostics and testing. However because of their extremely small impedances, most cells/batteries require large amplification of the time-varying voltage developed across their terminals during measurement. Accordingly, measurements are highly susceptible to corruption by ac hum at the powerline frequency and its harmonics. In a typical industrial setting, ac hum can be coupled into measurement circuitry by ac magnetic fields of nearby motors and transformers. In the case of on-line measurements, ac currents from poorly filtered rectifiers, chargers, and power inverters can introduce ac hum into the measurements.

The conventional approach to suppressing ac hum is to place appropriate notch filter circuitry in the high-gain amplifier chain. Such circuitry has been described in many literature references including Burr-Brown Application Bulletin AB-071, "Design a 60 hz Notch Filter with the UAF42", published by Texas Instruments Incorporated; Linear Brief 5, "High Q Notch Filter", published by National Semiconductor Corporation; and data sheets for the "LMF90 $4^{th}$-Order Elliptic Notch Filter", published by National Semiconductor Corporation.

There are, however, several disadvantages to the notch filter approach to hum suppression. First of all, maintaining the notch at exactly the powerline frequency generally requires precision components and/or trimming adjustments. Secondly, a single notch filter suppresses signals at only one frequency. Ac hum however, usually comprises a multitude of harmonically related frequencies. Third, although 60 Hz is the standard powerline frequency in most of the United States, 50 Hz is standard throughout much of the rest of the world, and 400 Hz is standard in many military and aircraft installations. Accordingly, apparatus manufactured for each of these markets would require different notch filters. Fourth, unless the notch is extremely narrow, the filter itself can affect measurements. Finally, a hardware notch filter can add substantially to manufacturing cost.

SUMMARY OF THE INVENTION

Methods and apparatus for measuring complex impedance and admittance of electrochemical cells/batteries and general electrical elements have recently been disclosed by Champlin in U.S. Pat. Nos. 6,002,238, 6,172,483, U.S. patent application Ser. No. 09/503,015 filed Feb. 12, 2000, now U.S. Pat. No. 6,262,563 and U.S. patent application Ser. No. 09/710,031 filed Nov. 10, 2000, now U.S. Pat. No. 6,294,876. Among the innovations disclosed therein is a novel technique for evaluating time-averaged fundamental-frequency Fourier coefficients of signals at a known measurement frequency. This new technique utilizes synchronous sampling, A/D conversion, summing or averaging over an integer number of periods, and computing the desired Fourier coefficients from the resulting sums or averages.

An inherent property of the disclosed evaluation procedure is the existence of perfect nulls in the frequency response of the Fourier coefficients. These perfect nulls occur at an infinite number of evenly spaced frequencies whose precise values are determined by both the fundamental measurement frequency $f_1$ and the number N of periods over which the digital samples are acquired. For a given measurement frequency $f_1$, the nulls can be placed at exactly the powerline frequency and its harmonics by appropriately choosing N. Particular values of N can even be found that place nulls at fundamental and harmonic frequencies of 50 Hz, 60 Hz, and 400 Hz simultaneously. Thus, a single measuring apparatus can be implemented that suppresses all components of powerline hum in substantially all U.S., foreign, and military/aircraft markets. Since the perfect nulls are, themselves, an intrinsic property of the Fourier evaluation procedure, they introduce no errors into the measurements. Additionally, the disclosed solution to the hum problem uses only software. It can therefore be applied to appropriately designed measuring apparatus essentially "free of charge". A specific application—that of suppressing powerline hum in ac measurements on electrochemical cells/batteries—is employed herein to demonstrate this novel technique. The technique, however, is more general than this particular application and can be applied to ac measurements on any electrical element. The disclosed method and apparatus are, in fact, universally applicable whenever one desires to evaluate a signal component at a known frequency in the presence of possible hum, noise, or other spurious interference at other known frequencies.

DETAILED DESCRIPTION OF THE ILLUSTRATIVE EMBODIMENTS

Figure 1:
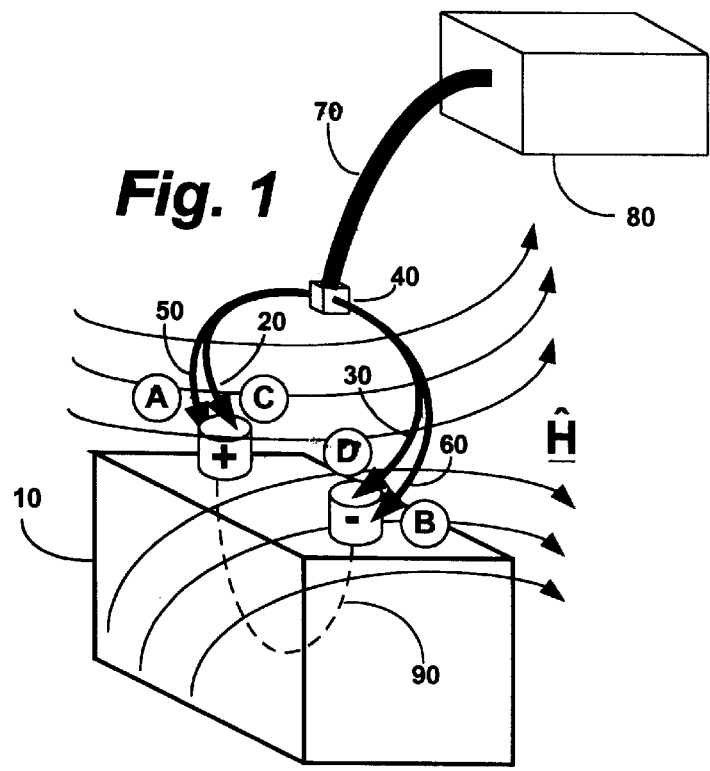
FIG. 1 is a drawing illustrating dynamic parameter measuring apparatus connected to a cell/battery in the presence of spurious ac magnetic fields.

FIG. 1 illustrates a typical arrangement for measuring a dynamic parameter of cell/battery 10 with apparatus 80 of the type disclosed by Champlin in the patents and patent applications referred to above. A time-varying current passes through the battery via current-carrying contacts A and B along with current-carrying leads 50 and 60, respectively. The resulting time-varying voltage is sensed by voltage-sensing contacts C and D along with voltage-sensing leads 20 and 30, respectively. The separate connections for voltage and current shown in FIG. 1 are known as Kelvin connections and effectively eliminate errors due to contact and lead-wire resistance. Although such connections are essential to accurately measure dynamic parameters of low impedance cells and batteries, the present inventions do not rely upon having Kelvin connections. The inventions disclosed herein would function equally well with single connections, common to both current and voltage, made to each terminal.

The two voltage-sensing leads 20 and 30 come together at Y-junction 40. They are then bundled together with current-carrying leads 50 and 60 in cable 70 and conducted to dynamic parameter measuring apparatus 80. Voltage-sensing leads 20, 30 and conducting path 90 through the cell/battery form a large closed loop. According to Faraday's law of induction, any time-varying magnetic field that penetrates this loop will induce a time-varying voltage into voltage-sensing leads 20 and 30. For a sinusoidally varying complex magnetic field vector $\hat{\underline{H}}$, the complex ac voltage $\hat{V}_{CD}$ induced into the voltage-sensing leads is $$\hat{V}_{CD} = j\omega\mu_0 \oiint \hat{\underline{H}} \cdot d\underline{S} \quad (1)$$

where $j=\sqrt{-1}$, $\omega=2\pi f$ is the angular frequency, $\mu_0$ is the magnetic permeability of free space, and $d\underline{S}$ is a differential area vector perpendicular to a surface bounded by the closed loop. If the magnetic field is fairly uniform over the loop, equation (1) can be approximated as $$\hat{V}_{CD} \approx j\omega\mu_0 \hat{H}_\perp A_L \quad (2)$$

where $\hat{H}_\perp$ is the component of $\hat{\underline{H}}$ perpendicular to the loop and $A_L$ is the area of the loop. Spurious voltage $\hat{V}_{CD}$ will be amplified along with the desired measurement signal developed across the terminals of cell/battery 10 by voltage amplification circuitry within apparatus 80.

In a typical location where cells and/or batteries are found in the field, ac magnetic fields due to nearby ac motors and transformers are often ubiquitous. Furthermore, magnetic nonlinearities usually cause such fields to have significant ac content at harmonics of the powerline frequency—in addition to content at the powerline frequency itself. As a consequence, and because of the large voltage gains required to accurately measure typical cells and batteries, magnetically induced ac voltages can pose a significant problem for dynamic parameter measurements in the field.

Figure 2:
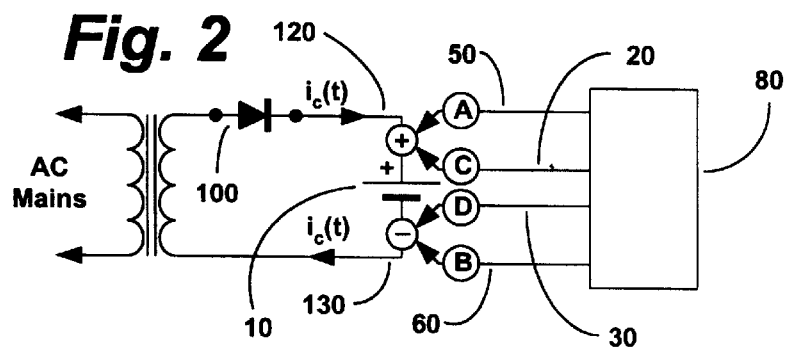
FIG. 2 is a schematic representation showing a dynamic parameter of a cell/battery being measured while the cell/battery is being charged by an unfiltered half-wave rectifier.
Figure 3:
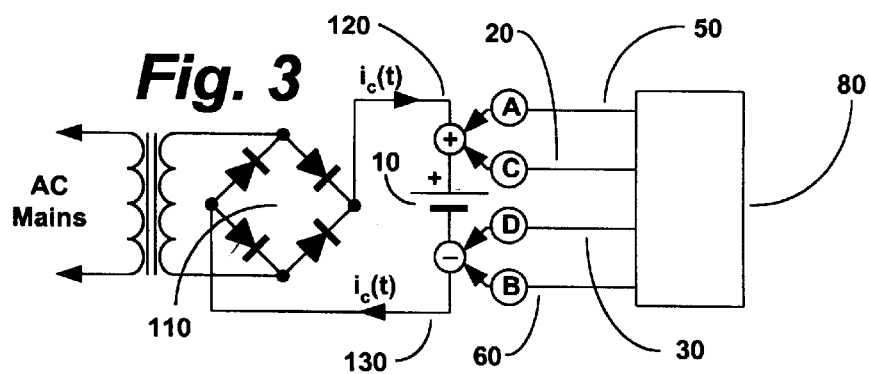
FIG. 3 is a schematic representation showing a dynamic parameter of a cell/battery being measured while the cell/battery is being charged by an unfiltered full-wave rectifier.

A related problem is illustrated in FIGS. 2 and 3. These two figures depict measuring a dynamic parameter of cell/battery 10 with measuring apparatus 80 while cell/battery 10 is being charged from ac mains by unfiltered half-wave rectifier 100 (FIG. 2) or by unfiltered full-wave rectifier 110 (FIG. 3). Because of the lack of filtering, the charging current $i_C(t)$ carried by conductors 120 and 130 will have significant ac content in each case. Ac current components will exist at frequencies that are integer multiples of the powerline frequency in the case of the half-wave rectifier (FIG. 2), and at frequencies that are integer multiples of twice the powerline frequency in the case of the full-wave rectifier (FIG. 3). In addition, a power inverter connected to the cell/battery could produce an ac discharging current $-i_C(t)$. Ac voltages developed across the terminals of cell/battery 10 in response to such ac charging/discharging currents can likewise constitute a significant measurement problem.

Figure 4:
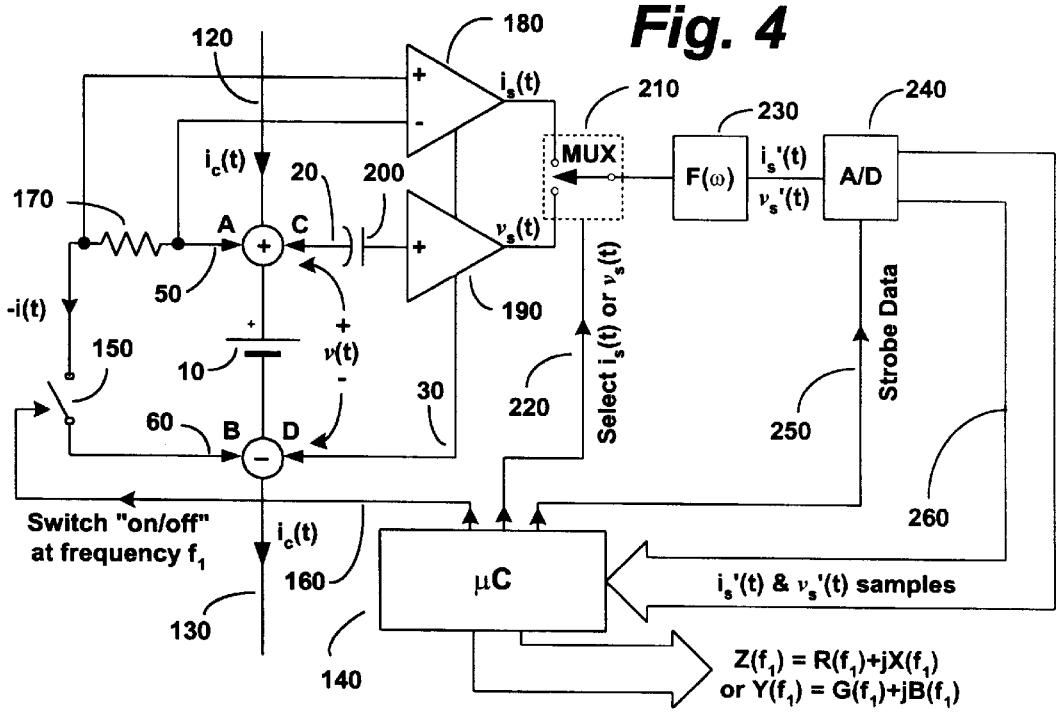
FIG. 4 is a block diagram showing apparatus representative of the measuring apparatus depicted in FIGS. 1, 2, and 3.

FIG. 4 shows a block diagram of apparatus representative of measuring apparatus 80 depicted in FIGS. 1, 2, and 3. Concomitant with apparatus 80 measuring cell/battery 10, a time-varying charging/discharging current $\pm i_C(t)$ passes through cell/battery 10 via conductors 120 and 130 as shown.

In the particular implementation shown in FIG. 4, microcontroller 140 commands switch 150 to turn "on" and "off" at frequency $f_1$ via command line 160. As a result, a square wave excitation current i(t) passes through cell/battery 10 by way of load resistor 170, current-carrying leads 50 and 60, and current-carrying contacts A and B. Amplifier 180 amplifies the voltage developed across load resistor 170 to produce an output current-signal $i_s(t)$ proportional to excitation current i(t).

The complete time-varying voltage v(t) developed across the terminals of cell/battery 10 is sensed at contacts C and D and coupled to the input of high-gain amplifier 190 by leads 20, 30 and coupling capacitor 200. Accordingly, a voltage-signal $v_s(t)$ proportional to v(t) appears at the output of amplifier 200. Since time-varying currents $i_C(t)$ and i(t) both pass through cell/battery 10, voltage signal $v_s(t)$ contains components responsive to spurious current $i_C(t)$ as well as components responsive to the excitation current i(t). Furthermore, if external ac magnetic fields couple to the voltage-sensing loop as depicted in FIG. 1, $v_s(t)$ will also contain additional spurious components induced by the magnetic field.

Microcontroller 140 commands multiplexer 210 via command line 220 to couple either current signal $i_s(t)$ or voltage signal $v_s(t)$ to the input of band-limiting filter 230. The two band-limited signals at the output of filter 230, either $i_s'(t)$ or $v_s'(t)$, couple to the input of A/D converter 240. Using command line 250, microcontroller 140 commands A/D converter 240 to sample each of these signals at specified times synchronized with the excitation current i(t) and to convert the resulting samples to digital format. Digital samples of each signal are, in this manner, synchronously acquired at M equally spaced times over each excitation period $T=1/f_1$ for a total of N periods. The resulting (M×N) digital current-signal samples and (M×N) digital voltage-signal samples are inputted to microcontroller 140 via data channel 260 and used to calculate real and imaginary parts of time-averaged complex Fourier coefficients of $i_s'(t)$ and $v_s'(t)$ at frequency $f_1$. Complex impedance $Z=R+jX$ and complex admittance $Y=1/Z=G+jB$ of cell/battery 10 at frequency $f_1$ follow by dividing these complex Fourier coefficients. However, the results of this computation may contain errors due to the spurious signal components contained in $v_s'(t)$.

Figure 5:
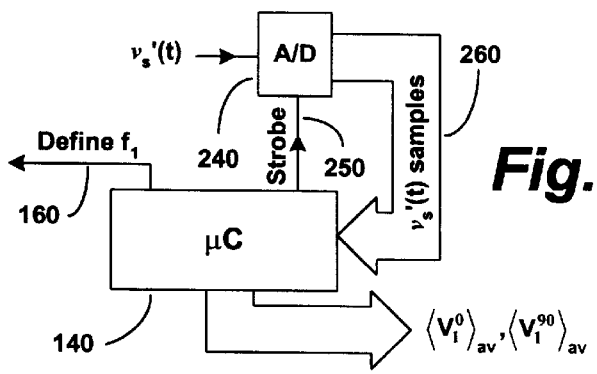
FIG. 5 is a block diagram identifying elements of the apparatus of FIG. 4 that are particularly pertinent to the inventions disclosed herein.

Elements of the apparatus of FIG. 4 that are particularly pertinent to the inventions disclosed herein are identified in FIG. 5. Microprocessor 140 defines a periodic excitation signal at frequency $f_1$ by virtue of commands issued on command line 160. As a result, the band-limited voltage signal $v_s'(t)$ inputted to A/D converter 240 contains a periodic response component $v_s'(t)$ having known period $T=1/f_1$. Assuming $k_{max}$ to be the index of the highest frequency harmonic of this desired signal, $v_s'(t)$ can be represented by the finite Fourier series $$v_s'(t) = V_0 + \sum_{k=1}^{k_{max}} \{V_k^0 \sin(2\pi k f_1 t) + V_k^{90} \cos(2\pi k f_1 t)\} \quad (3)$$

The quantities $V_k^0$ and $V_k^{90}$ are Fourier coefficients describing in-phase and quadrature voltage components of $v_s'(t)$, respectively, at frequency $kf_1$. The complex Fourier coefficients can be written in rectangular form as $\hat{V}_k = V_k^0 + jV_k^{90}$.

According to the well-known theory of Fourier analysis, the two fundamental-frequency (k=1) Fourier coefficients of equation (3) are given by the integrals $$V_1^0 = \frac{2}{T} \int_0^T v_s'(t) \sin(2\pi f_1 t) dt \quad \text{and} \quad (4)$$

$$V_1^{90} = \frac{2}{T} \int_0^T v_s'(t) \cos(2\pi f_1 t) dt \quad (5)$$

where the integrations extend over one period of the i(t) excitation, $T=1/f_1$. Equations (4) and (5), can be evaluated in terms of discrete samples of $v_s'(t)$ by numerical integration techniques such as the trapezoidal rule.

For M samples equally spaced over a period $T=1/f_1$, the trapezoidal rule yields $$V_1^0 = \frac{2}{M} \sum_{n=0}^{(M-1)} \left\{ v_s'\left(\frac{nT}{M}\right) \sin\left(\frac{2\pi n}{M}\right) \right\} \quad \text{and} \quad (6)$$

$$V_1^{90} = \frac{2}{M} \sum_{n=0}^{(M-1)} \left\{ v_s'\left(\frac{nT}{M}\right) \cos\left(\frac{2\pi n}{M}\right) \right\} \quad (7)$$

Although numerical integrations are generally regarded as approximations, my calculations prove that equations (6) and (7) yield exact results as long as M, the number of samples acquired over a period, satisfies the following criterion:

$$M \geq (k_{max}+2) \quad (8)$$

In the absence of spurious hum and noise, $v_s'(t)=v_s'(t)$. In this case, microcontroller 140 could determine $V_1^0$ and $V_1^{90}$ exactly by commanding A/D converter to acquire $M \geq (k_{max}+2)$ equally-spaced samples over one period, inputting these M samples via data channel 260, and evaluating equations (6) and (7). However, with spurious hum and noise signals present, Fourier coefficients determined in this manner would contain errors. Since spurious hum and noise signals are, in general, not correlated with $v_s'(t)$, averaging over time could ameliorate this problem.

Consider averaging the fundamental-frequency Fourier coefficients over an integer number N of periods. By averaging equations (4) and (5), the time-averaged fundamental frequency Fourier coefficients can be written $$\langle V_1^0 \rangle_{av} = \frac{2}{NT} \int_0^{NT} v_s'(t) \sin(2\pi f_1 t) dt \quad \text{and} \quad (8)$$

$$\langle V_1^{90} \rangle_{av} = \frac{2}{NT} \int_0^{NT} v_s'(t) \cos(2\pi f_1 t) dt \quad (9)$$

where the integrations now extend over the interval NT.

One could evaluate the integrals in equations (8) and (9) directly by applying the trapezoidal rule. However, computing these numerical results could be rather time-consuming since they would involve evaluating two sets of sine/cosine summations with each summation containing (N×M) terms.

Considerable improvement in computation speed can be realized by recognizing that trapezoidal rule summations express linear relationships. Accordingly, the order of averaging and of summing can be interchanged. That is, the average of the sum is equal to the sum of the averages:

$$\langle V_1^0 \rangle_{av} = \left\langle v_s'(0)\sin(0) + v_s'\left(\frac{T}{M}\right)\sin\left(\frac{2\pi}{M}\right) + \right. \quad (10)$$
$$\left. v_s'\left(\frac{2T}{M}\right)\sin\left(\frac{4\pi}{M}\right) + \cdots \right\rangle_{av}$$
$$= \langle v_s'(0)\rangle \sin(0) + \left\langle v_s'\left(\frac{T}{M}\right)\right\rangle_{av} \sin\left(\frac{2\pi}{M}\right) +$$
$$\left\langle v_s'\left(\frac{2T}{M}\right)\right\rangle_{av} \sin\left(\frac{4\pi}{M}\right) + \cdots$$

with similar results applying to $\langle V_1^{90} \rangle_{av}$.

Accordingly, microcontroller 140 can advantageously evaluate time-averaged Fourier coefficients by simply averaging the sampled values themselves over N periods and then applying the trapezoidal rule to the M values of time-averaged samples as if they had all been acquired in a single period. The N-period sample-averages are written $$\left\langle v_s'\left(\frac{nT}{M}\right)\right\rangle_{av} = \frac{1}{N} \sum_{p=0}^{(N-1)} v_s'\left(\frac{nT}{M} + pT\right) \quad (11)$$

where the index n ranges from 0 to (M−1). Applying the trapezoidal rule to these M time-averaged values leads to $$\langle V_1^0 \rangle_{av} = \frac{2}{M} \sum_{n=0}^{(M-1)} \left\{ \left\langle v_s'\left(\frac{nT}{M}\right)\right\rangle_{av} \sin\left(\frac{2\pi n}{M}\right) \right\} \quad \text{and} \quad (12)$$

$$\langle V_1^{90} \rangle_{av} = \frac{2}{M} \sum_{n=0}^{(M-1)} \left\{ \left\langle v_s'\left(\frac{nT}{M}\right)\right\rangle_{av} \cos\left(\frac{2\pi n}{M}\right) \right\} \quad (13)$$

The resulting complex time-averaged fundamental-frequency Fourier coefficient can be written in rectangular form as $$\langle \hat{V}_1 \rangle_{av} = \langle \hat{V}_1^0 \rangle_{av} + j \langle \hat{V}_1^{90} \rangle_{av} \quad (14)$$

or, in terms of magnitude and phase as $$|<\hat{V}_1>_{av}| = \sqrt{(<V_1^{0>}_{av})^2 + (<V_1^{90}>_{av})^2} \quad (15)$$

and $$\langle\Theta_1\rangle_{av} = \arctan\left(\frac{\langle V_1^{90}\rangle_{av}}{\langle V_1^{0}\rangle_{av}}\right). \quad (16)$$

Figure 6:
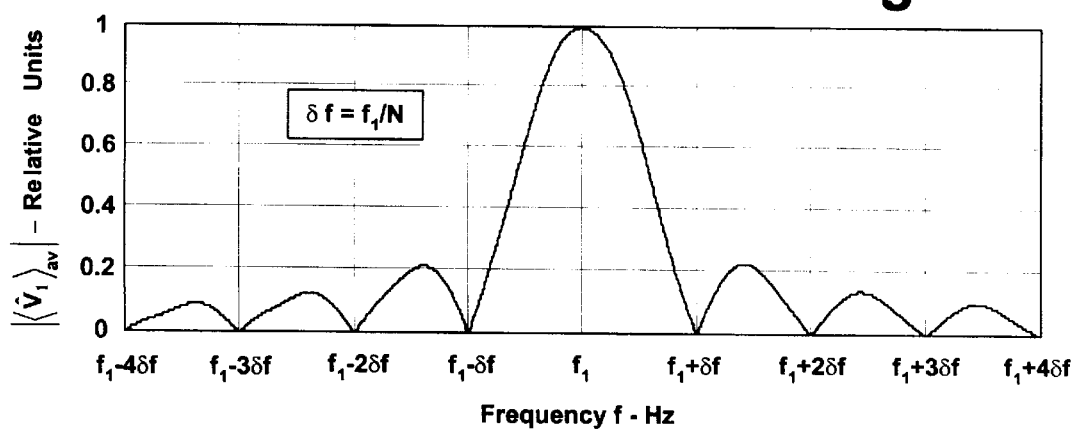
FIG. 6 is a plot of the normalized frequency response of the apparatus depicted in FIG. 5.

Values of $|<\hat{V}_1>_{av}|$ as a function of a general frequency f have been calculated by assuming a variable-frequency input signal of the form $$v_s'(f,t) = \sin(2\pi ft + \phi), \quad (17)$$

sampling this signal M times per period $T = 1/f_1$ over a total of N periods, and then applying equations (11), (12), (13), and (15). FIG. 6 discloses one result of these calculations.

FIG. 6 shows that the Fourier amplitude $|<\hat{V}_1>_{av}|$ reaches maximum at exactly the synchronous (measurement) frequency, $f_1$. On either side of $f_1$, perfect uniformly-spaced nulls occur at frequencies separated by the interval $\delta f$. I have found that the null frequency separation $\delta f$ is independent of the number of samples acquired per period M. As long as $M \geq 3$, $\delta f$ exists and is a function of only the synchronous (measurement) frequency $f_1$ and the number of periods N over which the samples are acquired. This relationship can be expressed as $$\delta f = f_1/N \quad (18)$$

Since these nulls are "perfect" (i.e., identically zero response at the null frequency), the constant (1/N) multiplying equation (11) and the constant (2/M) multiplying equations (12) and (13) are of no consequence insofar as the nulls are concerned. Summations alone will serve to produce perfect nulls in the computed results.

By appropriate null frequency selection, the perfect nulls disclosed in FIG. 6 could be used to suppress powerline hum or other spurious signals existing at known interference frequencies. However, in order to accomplish this very desirable result, it is necessary to first understand the basic principles involved and to thereby establish rules for determining N. These rules comprise an essential part of my invention.

Assume an integer measurement frequency $f_1$ along with hum or other spurious signals at integer interference frequencies $f_{sp}^1, f_{sp}^2, \ldots, f_{sp}^n$. I have determined that nulls can be placed at all of the interference frequencies and their harmonics by choosing the frequency interval between nulls $\delta f$ to be a common factor (cf) of both the measurement frequency $f_1$ and all of the fundamental interference frequencies. That is choose $$\delta f = cf(f_1, f_{sp}^1, f_{sp}^2, \ldots, f_{sp}^n) \quad (19)$$

where cf( ) means "common factor of ( )". According to equation (18), the corresponding value of N is then $$N = \frac{f_1}{\delta f} = \frac{f_1}{cf(f_1, f_{sp}^1, f_{sp}^2, \cdots, f_{sp}^n)} \quad (20)$$

Choosing N to satisfy equation (20) will ensure that perfect nulls exist at all fundamental and harmonic frequencies of the hum/spurious signals. Equation (20) is thus a valid solution to the problem. However, it is not the only solution.

To determine the most general solution, consider the greatest common factor (gcf) of frequencies $f_1$ and $f_{sp}^1$, $f_{sp}^2, \ldots, f_{sp}^n$. The largest frequency interval between nulls that can exist and still provide nulls at all of the interference frequencies is equal to this greatest common factor. That is $$\delta f_{MAX} = gcf(f_1, f_{sp}^1, f_{sp}^2, \ldots, f_{sp}^n) \quad (21)$$

Using $\delta f_{MAX}$ in equation (18) establishes the minimum value of N, $N_{MIN}$, that will place nulls at all fundamental and harmonic frequencies of all hum/spurious signals $$N_{MIN} = \frac{f_1}{\delta f_{MAX}} = \frac{f_1}{gcf(f_1, f_{sp}^1, f_{sp}^2, \cdots, f_{sp}^n)} \quad (22)$$

Any integral multiple of $N_{MIN}$ will likewise place nulls at all fundamental and harmonic interference frequencies. Accordingly, the most general solution to the problem can be written $$N_n = \frac{n \cdot f_1}{\delta f_{MAX}} = \frac{n \cdot f_1}{gcf(f_1, f_{sp}^1, f_{sp}^2, \cdots, f_{sp}^n)} \quad (23)$$

where n=1, 2, 3, . . . is any positive integer.

Equation (23) discloses a very general rule that permits determining N whenever the frequencies $f_1$ and $f_{sp}^1$, $f_{sp}^2, \ldots, f_{sp}^n$ are integers. I have found that this general rule can be easily extended to include frequencies that are rational fractions (i.e., ratios of integers) by simply extending the definition of the gcf to include a rational fractional result. Consider the following examples:

EXAMPLE 1

$f_1 = 55$ Hz, $f_{sp}^1 = 50$ Hz, $f_{sp}^2 = 60$ Hz, $f_{sp}^3 = 400$ Hz

In this example, the desired measurement frequency is halfway between standard European and U.S. powerline frequencies. This would pose an extremely difficult challenge for conventional notch filters.

Figure 7:
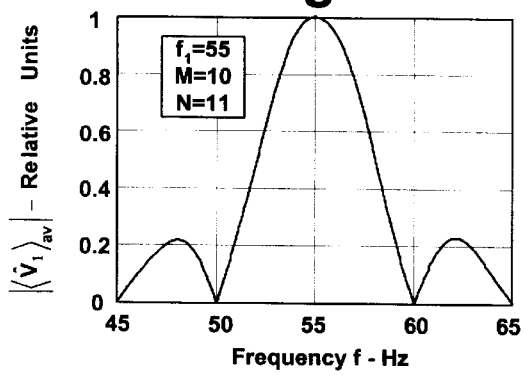
FIG. 7 is a frequency response plot illustrating conditions between 45 Hz and 65 Hz in the case of a measurement frequency $f_1$=55 Hz along with perfect nulls placed simultaneously at 50 Hz, 60 Hz, and 400 Hz according to one aspect of the present invention.
Figure 8:
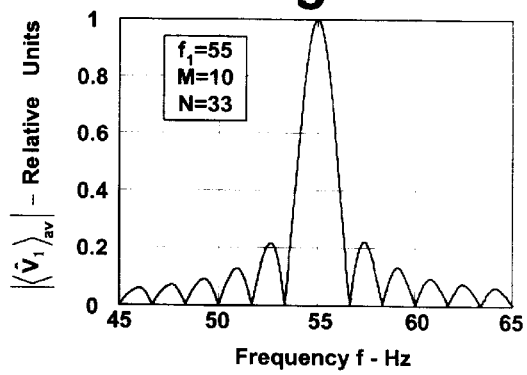
FIG. 8 is a frequency response plot illustrating conditions between 45 Hz and 65 Hz in the case of a measurement frequency $f_1$=55 Hz along with perfect nulls placed simultaneously at 50 Hz, 60 Hz, and 400 Hz according to another aspect of the present invention.

The greatest common factor (gcf) of 50, 55, 60, and 400 is 5. Thus $\delta f_{MAX} = 5$ Hz and $N_{MIN} = 55/5 = 11$. Setting N equal to any integral multiple of 11 will therefore simultaneously place perfect nulls at 50, 60, and 400 Hz as well as at all harmonics of these frequencies. The calculated plots of FIGS. 7 and 8 illustrate null placement between 45 Hz and 65 Hz for N=11 and for N=33, respectively. FIG. 7 shows that choosing N=11 places perfect nulls every 5 Hz either side of 55 Hz. FIG. 8 shows that choosing N=33 places perfect nulls every 5/3 Hz either side of 55 Hz. One sees further that either choice places perfect nulls at both 50 Hz and 60 Hz as well at all harmonics of these two frequencies. One can likewise show that either choice also places perfect nulls at 400 Hz and its harmonics.

EXAMPLE 2

$f_1 = 46$ Hz, $f_{sp}^1 = 50$ Hz, $f_{sp}^2 = 60$ Hz, $f_{sp}^3 = 400$ Hz

Figure 9:
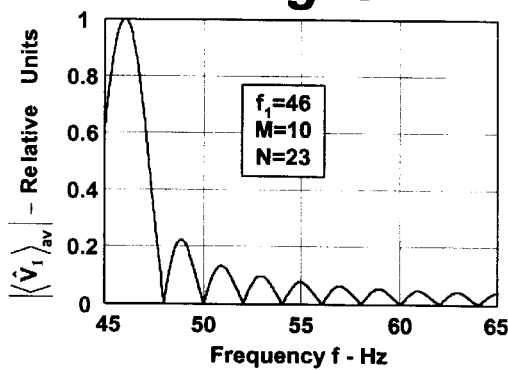
FIG. 9 is a frequency response plot illustrating conditions between 45 Hz and 65 Hz in the case of a measurement frequency $f_1=46$ Hz and perfect nulls placed simultaneously at 50 Hz, 60 Hz, and 400 Hz according to still another aspect of the present invention.

The greatest common factor (gcf) of 46, 50, 60, and 400 is 2. Thus $\delta f_{MAX} = 2$ Hz and $N_{MIN} = 46/2 = 23$. Setting N equal to any integral multiple of 23 will therefore place perfect nulls at 50 Hz, 60 Hz, and 400 Hz simultaneously as well at all harmonics of these frequencies. The calculated plot of FIG. 9 illustrates this null placement between 45 Hz and 65 Hz for the case of N=23. Note that $N = N_{MIN} = 23$ places perfect nulls every $\delta f_{MAX} = 2$ Hz and that perfect nulls do indeed occur at both 50 Hz and 60 Hz.

EXAMPLE 3

$f_1 = 62.5$ Hz, $f_{sp}^1 = 50$ Hz, $f_{sp}^2 = 60$ Hz, $f_{sp}^3 = 400$ Hz

Figure 10:
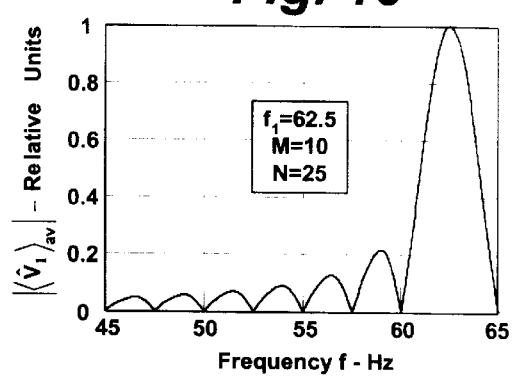
FIG. 10 is a frequency response plot illustrating conditions between 45 Hz and 65 Hz in the case of a measurement frequency $f_1=62.5$ Hz and perfect nulls placed simultaneously at 50 Hz, 60 Hz, and 400 Hz according to still another aspect of the present invention.

This is an example in which the measurement frequency is a rational fraction (ratio of integers: $f_1 = 125/2$). The (extended) greatest common factor (gcf) of 125/2, 50, 60, and 400 is 5/2. Thus $\delta f_{MAX}$=2.5 Hz and $N_{MIN}$=62.5/2.5=25. Setting N equal to any integral multiple of 25 will therefore place perfect nulls at 50 Hz, 60 Hz, and 400 Hz simultaneously as well at all harmonics of these frequencies. The calculated plot of FIG. 10 illustrates this null placement between 45 Hz and 65 Hz for the case of N=25. Note that N=$N_{MIN}$=25 places perfect nulls every $\delta f_{MAX}$=2.5 Hz and that perfect nulls do indeed occur at both 50 Hz and 60 Hz.

All of the calculated plots in the above three examples assume M=10 samples acquired per period. This assumption does not significantly affect the plots since, as stated previously, $\delta f = f_1/N$ is independent of the number of samples acquired per period, M. The quantity M primarily affects "aliasing" of the input signal. Such effects can only be observed at frequencies that are particular harmonics of the synchronous measurement frequency, $f_1$.

I have determined that "alias" peaks in the frequency response of $|<\hat{V}_1>_{av}|$ occur at frequencies given by either (nM-1)·$f_1$ or (nM+1)·$f_1$, where n=1, 2, 3, . . . is a positive integer. Although band-limiting filter 230 will generally suppress hum/spurious components at these "alias" response frequencies, a large enough signal at a low spurious frequency $f_{sp}$ might slip past band-limiting filter 230. If this $f_{sp}$ happens to coincide with the lowest "alias" response frequency (M-1)·$f_1$, a problem may result. Such "aliasing" problems can be avoided, however, by choosing the number of samples acquired per period to satisfy $$M > 1 + f_{sp}(\max)/f_1 \quad (24)$$

where $f_{sp}(\max)$ is the largest of the fundamental interference frequencies. Consider the following example:

EXAMPLE 4

$f_1$=20 Hz, $f_{sp}^1$=50 Hz, $f_{sp}^2$=60 Hz

The greatest common factor (gcf) of 20, 50, and 60 is 10. Thus $\delta f_{MAX}$=10 Hz and $N_{MIN}$=20/10=2. Letting N equal any integral multiple of 2 should therefore place perfect nulls at both fundamental interference frequencies and their harmonics.

Figure 11:
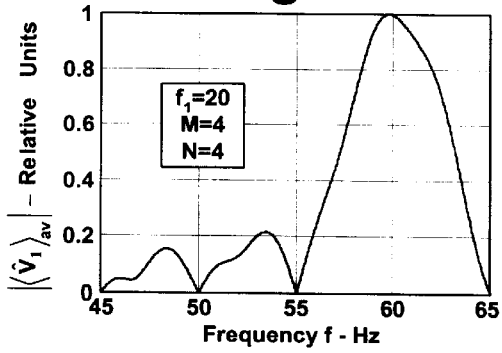
FIG. 11 is a frequency response plot for $f_1=20$ Hz, M=4, and N=4 showing that the anticipated null at 60 Hz is missing as a consequence of acquiring M=4 samples per period.
Figure 12:
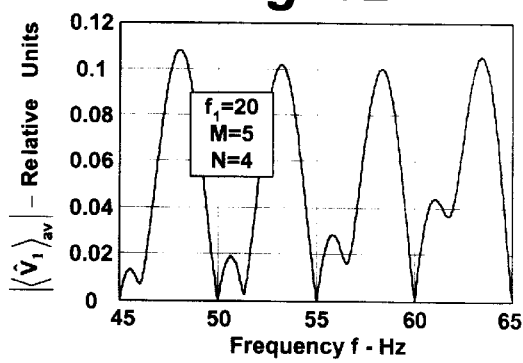
FIG. 12 is a frequency response plot for $f_1=20$ Hz, M=5, and N=4 showing the effect of increasing the number of samples acquired per period from M=4 to M=5.

FIG. 11 shows a calculated frequency plot of $|<\hat{V}_1>_{av}|$ for $f_1$=20 Hz, M=4, and N=4. Instead of the expected null at 60 Hz, one observes a response peak at this frequency. This is because the lowest "alias" response frequency, (4−1)·20=60 Hz, coincides with $f_{sp}^2$=60 Hz. FIG. 12 shows the effect of simply increasing M to 5 so that inequality (24) is satisfied. In complete agreement with the theory disclosed above, the response peak at $f_{sp}^1$=60 Hz has been replaced by a perfect null in FIG. 12.

This completes the disclosure of my invention. A specific example—that of suppressing powerline hum in ac measurements of electrochemical cells/batteries—has been considered in detail to demonstrate this novel technique. However, the technique is more general than that one particular application and actually applies generally to ac measurements performed on any electrical element. The disclosed technique can, in fact, be used whenever one desires to detect a signal at a known frequency in the presence of possible hum, noise, or other spurious interference at other known frequencies.

Although the present invention has been described with reference to preferred embodiments, workers skilled in the art will recognize that changes can be made in form and detail without departing from the true spirit and scope of the invention. For example, time-averaged Fourier coefficients can be determined by either evaluating weighted sums containing (N×M) terms, or by averaging individual samples over N periods and then evaluating M-term weighted sums of these averages. (see equation (10)). Furthermore, the time-averages over N periods (equation (11)) can be replaced by simple sums over N periods without affecting either the location or the depth of the nulls. Measurement steps can occur in different orders or occur substantially simultaneously. The time-averaged Fourier coefficients can be calculated in real time by means of a microprocessor or a microcontroller intrinsic to self-contained measuring apparatus. Such real-time results could be used or displayed in a variety ways including digital to analog conversion providing an analog signal output. Time-averaged Fourier coefficients could also be calculated at a later time after measurements are performed by using pre-recorded data samples and a hand calculator or computer. These and other variations are believed to be well within the scope of the present invention and are intended to be covered by the appended claims.

What is claimed is:

1. A method for evaluating a component of a signal at a measurement frequency while suppressing potential components at one or more interference frequencies comprising:
   sampling said signal M times per period of said measurement frequency for N said periods, said number N being an integral multiple of said measurement frequency divided by the greatest common factor of said measurement frequency and said interference frequencies;
   summing each of said M signal samples per period over said N periods to obtain M sample sums;
   evaluating said component of said signal at said measurement frequency from said M sample sums.

2. A method as in claim 1 wherein at least one said interference frequency is a powerline frequency.

3. A method as in claim 1 wherein at least one said interference frequency is 50 Hz, 60 Hz, or 400 Hz.

4. A method as in claim 1 wherein said measurement frequency and said interference frequencies are integers.

5. A method as in claim 1 wherein at least one of said measurement frequency and said interference frequencies is a rational fraction.

6. A method as in claim 1 wherein M is larger than one plus a ratio comprising the largest of said interference frequencies divided by said measurement frequency.

7. A method as in claim 1 wherein said signal is derived from a time-varying voltage developed across terminals of an electrochemical cell or battery during measurement of a dynamic parameter.

8. A method as in claim 1 wherein said signal is derived from a time-varying voltage developed across an electrical element during measurement of a dynamic parameter.

9. A method as in claim 1 wherein said component of said signal at said measurement frequency comprises a Fourier coefficient.

10. Apparatus for evaluating a component of a signal at a measurement frequency while suppressing potential components at one or more interference frequencies adapted to perform the method according to claim 1.

11. A method for evaluating a component of a signal at a measurement frequency while suppressing potential components at one or more interference frequencies comprising:
   obtaining (M×N) samples of said signal by sampling at (M×N) discrete times distributed uniformly over N consecutive periods of said measurement frequency, where N is an integral multiple of said measurement frequency divided by the greatest common factor of said measurement frequency and said discrete interference frequencies;

evaluating said component of said signal at said measurement frequency from said (M×N) samples.

12. A method as in claim 11 wherein said evaluating comprises summing each said sample acquired in a said period over N said periods to obtain M sample sums and evaluating said component of said signal at said measurement frequency from said M sample sums.

13. A method as in claim 11 wherein said evaluating comprises evaluating said component of said signal at said measurement frequency from a weighted summation containing (M×N) terms.

14. A method as in claim 11 wherein at least one said interference frequency is a powerline frequency.

15. A method as in claim 11 wherein at least one said interference frequency is 50 Hz, 60 Hz, or 400 Hz.

16. A method as in claim 11 wherein said measurement frequency and said interference frequencies are integers.

17. A method as in claim 11 wherein at least one of said measurement frequency and said interference frequencies is a rational fraction.

18. A method as in claim 11 wherein M is larger than one plus a ratio comprising the largest of said interference frequencies divided by said measurement frequency.

19. A method as in claim 11 wherein said signal is derived from a time-varying voltage developed across terminals of an electrochemical cell or battery during measurement of a dynamic parameter.

20. A method as in claim 11 wherein said signal is derived from a time-varying voltage developed across an electrical element during measurement of a dynamic parameter.

21. A method as in claim 11 wherein said component of said signal at said measurement frequency comprises a Fourier coefficient.

22. Apparatus for evaluating a component of a signal at a measurement frequency while suppressing potential components at one or more interference frequencies adapted to perform the method according to claim 11.

23. A method for introducing a response peak at a desired response frequency and response nulls at one or more undesired response frequencies in the detected response of a measurement signal comprising:

obtaining (M×N) samples of said measurement signal by uniformly sampling at (M×N) discrete times distributed over N consecutive periods of said desired response frequency, where N is an integral multiple of said desired response frequency divided by the greatest common factor of said desired response frequency and said undesired response frequencies;

determining said detected response from said (M×N) samples.

24. A method as in claim 23 wherein said step of determining comprises summing each of said M samples over N said periods to obtain M sample averages and evaluating said detected response from said M sample averages.

25. A method as in claim 23 wherein said step of determining comprises evaluating said detected response from a weighted summation containing (M×N) terms.

26. A method as in claim 23 wherein at least one undesired response frequency is a powerline frequency.

27. A method as in claim 23 wherein at least one said undesired response frequency is 50 Hz, 60 Hz, or 400 Hz.

28. A method as in claim 23 wherein said desired response frequency and said undesired response frequencies are integers.

29. A method as in claim 23 wherein at least one of said desired response frequency and said undesired response frequencies is a rational fraction.

30. A method as in claim 23 wherein M is larger than one plus a ratio comprising the largest said undesired response frequency divided by said desired response frequency.

31. A method as in claim 23 wherein said measurement signal is derived from a time-varying voltage developed across terminals of an electrochemical cell or battery during measurement of a dynamic parameter.

32. A method as in claim 23 wherein said measurement signal is derived from a time-varying voltage developed across an electrical element during measurement of a dynamic parameter.

33. A method as in claim 23 wherein said detected response comprises a Fourier coefficient.

34. Apparatus for introducing a response peak at a desired response frequency and response nulls at one or more undesired response frequencies in the detected response of a measurement signal adapted to perform the method according to claim 23.

35. A method for introducing a response peak at a desired response frequency and response nulls at one or more undesired response frequencies in the detected response of a measurement signal comprising:

sampling said measurement signal M times per period of said desired response frequency for N said periods, said number N being an integral multiple of said desired response frequency divided by the greatest common factor of said desired response frequency and said undesired response frequencies;

summing each of said M signal samples per period over said N periods to obtain M sample sums;

determining said detected response from said M sample sums.

36. A method as in claim 35 wherein said detected response comprises a Fourier coefficient.

37. A method as in claim 35 wherein at least one said undesired response frequency is a powerline frequency.

38. A method as in claim 35 wherein at least one said undesired response frequency is 50 Hz, 60 Hz, or 400 Hz.

39. A method as in claim 35 wherein said desired response frequency and said undesired response frequencies are integers.

40. A method as in claim 35 wherein at least one of said desired response frequency and said undesired response frequencies is a rational fraction.

41. A method as in claim 35 wherein M is larger than one plus a ratio comprising the largest said undesired response frequency divided by said desired response frequency.

42. A method as in claim 35 wherein said measurement signal is derived from a time-varying voltage developed across terminals of an electrochemical cell or battery during measurement of a dynamic parameter.

43. A method as in claim 35 wherein said measurement signal is derived from a time-varying voltage developed across an electrical element during measurement of a dynamic parameter.

44. Apparatus for introducing a response peak at a desired response frequency and response nulls at one or more undesired response frequencies in the detected response of a measurement signal adapted to perform the method according to claim 35.

45. Apparatus for detecting a signal component at a measurement frequency while suppressing potential interference components at one or more interference frequencies comprising:

sample and convert circuitry adapted to provide digital representations of sampled values of said signal, said sampled values acquired at (M×N) sampling times distributed uniformly over N periods of said measurement frequency, where N is an integral multiple of said measurement frequency divided by the greatest common factor of said measurement frequency and said interference frequencies; and, computation and control circuitry coupled to said sample and convert circuitry and adapted to initiate said sampling times, to accept said digital representations as inputs, and to compute said signal component at said measurement frequency from said digital representations.

46. Apparatus as in claim 45 wherein said computation and control circuitry computes said signal component by summing said digital representations over said N periods to obtain M sums and numerically combining said M sums.

47. Apparatus as in claim 45 wherein said computation and control circuitry computes said signal component by evaluating weighted summations containing (M×N) terms.

48. Apparatus as in claim 45 wherein at least one said interference frequency is a powerline frequency.

49. Apparatus as in claim 45 wherein at least one said interference frequency is 50 Hz, 60 Hz, or 400 Hz.

50. Apparatus as in claim 45 wherein said measurement frequency and said one or more interference frequencies are integers.

51. Apparatus as in claim 45 wherein at least one of said measurement frequency and said interference frequencies is a rational fraction.

52. Apparatus as in claim 45 wherein M is larger than one plus a ratio comprising the largest said interference frequency divided by said measurement frequency.

53. Apparatus as in claim 45 wherein said signal is derived from a time-varying voltage developed across terminals of an electrochemical cell or battery during measurement of a dynamic parameter.

54. Apparatus as in claim 45 wherein said signal is derived from a time-varying voltage developed across an electrical element during measurement of a dynamic parameter.

55. Apparatus as in claim 45 wherein said signal component at said measurement frequency comprises a Fourier coefficient.

56. Apparatus for determining a Fourier coefficient of a band-limited signal at a desired response frequency and nulling out response at one or more undesired response frequencies comprising:

sample and convert circuitry adapted to provide digital representations of sampled values of said band-limited signal, said sampled values acquired at (M×N) sampling times distributed uniformly over N periods of said desired response frequency, where N is an integral multiple of said desired response frequency divided by the greatest common factor of said desired response frequency and said undesired response frequencies; and, computation and control circuitry coupled to said sample and convert circuitry and adapted to initiate said sampling times, to accept said digital representations as inputs, and to compute said Fourier coefficient from said digital representations.

57. Apparatus as in claim 56 wherein said computation and control circuitry computes said Fourier coefficient by summing or averaging said samples over said N periods to obtain M sample averages and calculating said Fourier coefficient from said M sample averages.

58. Apparatus as in claim 56 wherein said computation and control circuitry computes said Fourier coefficient by evaluating weighted sine/cosine summations containing (M×N) terms.

59. Apparatus as in claim 56 wherein at least one said undesired response frequency is a powerline frequency.

60. Apparatus as in claim 56 wherein at least one said undesired response frequency is 50 Hz, 60 Hz, or 400 Hz.

61. Apparatus as in claim 56 wherein said desired response frequency and said undesired response frequencies are integers.

62. Apparatus as in claim 56 wherein at least one of said desired response frequency and said undesired response frequencies is a rational fraction.

63. Apparatus as in claim 56 wherein M is larger than one plus a ratio comprising the largest said undesired response frequency divided by said desired response frequencies.

64. Apparatus as in claim 56 wherein said band-limited signal is derived from a time-varying voltage developed across terminals of an electrochemical cell or battery during measurement of a dynamic parameter.

65. Apparatus as in claim 56 wherein said band-limited signal is derived from a time-varying voltage developed across an electrical element during measurement of a dynamic parameter.

66. Apparatus as in claim 56 wherein said Fourier coefficient of said band-limited signal is an in-phase or quadrature Fourier coefficient of said band-limited signal at said desired response frequency.

67. Apparatus for evaluating a dynamic parameter of an electrochemical cell or battery at a measurement frequency while suppressing possible signals at one or more interference frequencies comprising:

excitation circuitry coupled to said cell or battery and adapted to apply periodic excitation to said cell or battery, said periodic excitation characterized by a period equal to the reciprocal of said measurement frequency;

excitation signal sensing and processing circuitry coupled to said excitation circuitry and adapted to provide an excitation signal in response to said periodic excitation;

response signal sensing and processing circuitry coupled to said cell or battery and adapted to provide a periodic response signal in accordance with the response of said cell or battery to said periodic excitation;

excitation signal sampling circuitry coupled to said excitation signal sensing and processing circuitry and adapted to provide sampled values of said excitation signal, said sampled values acquired at discrete excitation signal sampling times synchronized with said periodic excitation and uniformly distributed in time over consecutive periods of said periodic excitation;

response signal sampling circuitry coupled to said response signal sensing and processing circuitry and adapted to provide sampled values of said response signal, said sampled values acquired at (M×N) discrete response signal sampling times synchronized with said periodic excitation and uniformly distributed in time over N periods of said periodic excitation where N is an integral multiple of said discrete measurement frequency divided by the greatest common factor of said discrete measurement frequency and said one or more discrete interference frequencies; and, computation and control circuitry coupled to said excitation signal sampling circuitry and to said response signal sampling circuitry and adapted to combine said sampled values of said excitation signal and said sampled values of said response signal to evaluate said dynamic parameter of said electrochemical cell or battery at said discrete measurement frequency.

68. Apparatus as in claim 67 wherein said excitation signal sensing and processing circuitry and said response signal sensing and processing circuitry include band-limiting filter circuitry adapted to process said excitation signal and said response signal with identical band-limiting filter response functions.

69. Apparatus as in claim 67 wherein said computation and control circuitry is coupled to said excitation circuitry and is adapted to initiate the timing of said periodic excitation, the timing of said excitation signal sampling times, and the timing of said response signal sampling times, said computation and control circuitry identifying said excitation signal sampling times and said response signal sampling times by measuring time from a periodically repeating timing point of said periodic excitation.

70. Apparatus as in claim 69 wherein said excitation circuitry includes a controlled switch and said computation and control circuitry initiates said timing of said periodic excitation by periodically turning said controlled switch on and off thereby periodically interrupting a current through said cell or battery.

71. Apparatus as in claim 67 wherein said computation and control circuitry is further adapted to average said sampled values of said excitation signal over said consecutive periods to obtain averaged excitation signal samples, to average said sampled values of said response signal over said N periods to obtain averaged response signal samples, to numerically combine said averaged excitation signal samples and said averaged response signal samples to evaluate averaged Fourier coefficients, and to numerically combine said averaged Fourier coefficients to evaluate said dynamic parameter of said electrochemical cell or battery at said measurement frequency.

72. Apparatus as in claim 67 wherein at least one said interference frequency is a powerline frequency.

73. Apparatus as in claim 67 wherein at least one said interference frequency is 50 Hz, 60 Hz, or 400 Hz.

74. Apparatus as in claim 67 wherein said measurement frequency and said interference frequencies are integers.

75. Apparatus as in claim 67 wherein at least one of said measurement frequency and said interference frequencies is a rational fraction.

76. Apparatus as in claim 67 wherein M is larger than one plus a ratio comprising the largest of said interference frequencies divided by said measurement frequency.

77. A method for measuring a dynamic parameter of an electrochemical cell or battery at a measurement frequency while reducing errors due to possible interfering signals at one or more interference frequencies comprising:

exciting said cell or battery with a periodic time-varying current characterized by a smallest period equal to the reciprocal of said measurement frequency;

forming a current signal in accordance with said periodic time-varying current and a voltage signal in accordance with a time-varying response voltage across said cell or battery;

sampling said current signal at equally spaced times over an integer number of consecutive periods of said periodic time-varying current;

sampling said voltage signal at (M×N) equally spaced times over N consecutive periods of said periodic time-varying current, where N is an integral multiple of said measurement frequency divided by the greatest common factor of said measurement frequency and said one or more interference frequencies;

converting said sampled values of said current signal and said (M×N) sampled values of said voltage signal to digital format;

evaluating current signal Fourier coefficients from said sampled values of said current signal converted to digital format and evaluating voltage signal Fourier coefficients from said (M×N) sampled values of said voltage signal converted to digital format; and, numerically combining said current signal Fourier coefficients and said voltage signal Fourier coefficients to evaluate said dynamic parameter of said electrochemical cell or battery at said measurement frequency.

78. A method as in claim 77 wherein said forming includes processing said current signal and said voltage signal with identical band-limiting frequency response functions.

79. A method as in claim 77 wherein said periodic time-varying current comprises a periodic square-wave current.

80. A method as in claim 77 wherein said step of evaluating voltage signal Fourier coefficients comprises summing or averaging said (M×N) sampled values of said voltage signal converted to digital format over N said periods to obtain M voltage-signal sample averages and evaluating M-term weighted summations of said voltage-signal sample averages.

81. A method as in claim 77 wherein said step of evaluating voltage signal Fourier coefficients comprises evaluating (M×N)-term weighted summations of said (M×N) sampled values of said voltage signal converted to digital format.

82. A method as in claim 77 wherein at least one said interference frequency is a powerline frequency.

83. A method as in claim 77 wherein at least one said interference frequency is 50 Hz, 60 Hz, or 400 Hz.

84. A method as in claim 77 wherein said measurement frequency and said one or more interference frequencies are integers.

85. A method as in claim 77 wherein at least one of said measurement frequency and said interference frequencies is a rational fraction.

86. A method as in claim 77 wherein M is larger than one plus a ratio comprising the largest said interference frequency divided by said measurement frequency.

87. Apparatus for measuring a dynamic parameter of an electrochemical cell or battery at a measurement frequency while reducing errors due to possible interfering signals at one or more interference frequencies adapted to perform the method according to claim 77.

88. A method for measuring a dynamic parameter of an electrical element at a measurement frequency while reducing errors due to possible interfering signals at one or more interference frequencies comprising:

exciting said electrical element with periodic time-varying excitation characterized by a smallest period equal to the reciprocal of said measurement frequency;

forming an excitation signal in accordance with said periodic time-varying excitation and a response signal in accordance with a time-varying response of said electrical element;

sampling said excitation signal at equally spaced times over an integer number of consecutive periods of said periodic time-varying excitation;

sampling said response signal at (M×N) equally spaced times over N consecutive periods of said periodic time-varying excitation, where N is an integral multiple of said measurement frequency divided by the greatest common factor of said measurement frequency and said interference frequencies;

converting said sampled values of said excitation signal and said (M×N) sampled values of said response signal to digital format;

evaluating excitation signal Fourier coefficients from said sampled values of said excitation signal converted to digital format and evaluating response signal Fourier coefficients from said (M×N) sampled values of said response signal converted to digital format; and, numerically combining said excitation signal Fourier coefficients and said response signal Fourier coefficients to evaluate said dynamic parameter of said electrical element at said measurement frequency.

89. A method as in claim 88 wherein said forming includes processing said excitation signal and said response signal with identical band-limiting frequency response functions.

90. A method as in claim 88 wherein said periodic time-varying current comprises a periodic square-wave current.

91. A method as in claim 88 wherein said step of evaluating response signal Fourier coefficients comprises summing said (M×N) sampled values of said response signal converted to digital format over N said periods to obtain M response signal sample averages and evaluating M-term weighted summations of said M response signal sample averages.

92. A method as in claim 88 wherein said step of evaluating response signal Fourier coefficients comprises evaluating (M×N)-term weighted summations of said sampled values of said response signal converted to digital format.

93. A method as in claim 88 wherein at least one said interference frequency is a powerline frequency.

94. A method as in claim 88 wherein at least one interference frequency is 50 Hz, 60 Hz, or 400 Hz.

95. A method as in claim 88 wherein said measurement frequency and said interference frequencies are integers.

96. A method as in claim 88 wherein at least one of said measurement frequency and said interference frequencies is a rational fraction.

97. A method as in claim 88 wherein M is larger than one plus a ratio comprising the largest said interference frequency divided by said measurement frequency.

98. Apparatus for measuring a dynamic parameter of an electrical element at a measurement frequency while reducing errors due to possible interfering signals at one or more interference frequencies adapted to perform the method according to claim 88.

* * * * *

UNITED STATES PATENT AND TRADEMARK OFFICE
CERTIFICATE OF CORRECTION

PATENT NO.    : 6,417,669 B1
DATED         : July 9, 2002
INVENTOR(S)   : Keith S. Champlin It is certified that error appears in the above-identified patent and that said Letters Patent is hereby corrected as shown below:

<u>Title page,</u>
Item [56], References Cited, U.S. PATENT DOCUMENTS, insert
-- 3,984,768    10/1976    Staples . . . . . . . . . 324/62 --.
Change:
" 4,667,146  A  5/1987    Cooper et al. . . . . . 320/22" to
-- 4,667,143  A  5/1987    Cooper et al. . . . . . 320/22 --
" 5,338,515  A  8/1994    Betta et al. . . . . . . . 422/95" to
-- 5,338,515  A  8/1994    Della Betta et al. . . 422/95 --

<u>Column 6,</u>
Equation (14), change:

$$ \text{"} \langle \hat{V}_1 \rangle_{av} = \langle \hat{V}_1^0 \rangle_{av} j \langle \hat{V}_1^{90} \rangle_{av} \qquad (14)\text{" to} $$

$$ -- \langle \hat{V}_1 \rangle_{av} = \langle \hat{V}_1^0 \rangle_{av} + j \langle \hat{V}_1^{90} \rangle_{av} \qquad (14)--. $$

<u>Column 7,</u>
Equation (15), change:

$$ \text{"} |\langle \hat{V}_1 \rangle_{av}| = \sqrt{<V_1 0>_{av})^2 + (<V_1^{90}>_{av})^2} \qquad (15)\text{" to} $$

$$ -- |\langle \hat{V}_1 \rangle_{av}| = \sqrt{(\langle V_1^0 \rangle_{av})^2 + (\langle V_1^{90} \rangle_{av})^2} \qquad (15)--. $$

Equation (17), change:

$$ \text{"} v_s'(f,t) = \sin(2\pi ft + \phi), \qquad (17)\text{" to} $$

$$ -- v_s'(f,t) = \sin(2\pi ft + \varphi), \qquad (17)--. $$

Signed and Sealed this

Thirteenth Day of May, 2003

JAMES E. ROGAN
*Director of the United States Patent and Trademark Office*